United States Patent [19]
Nogami

[11] Patent Number: 5,763,324
[45] Date of Patent: Jun. 9, 1998

[54] METHOD OF MANUFACTURING A SEMICONDUCTOR DEVICE WITH IMPROVED UNIFORMITY OF BURIED CONDUCTOR IN CONTACT HOLES

[75] Inventor: Syoji Nogami, Oita, Japan

[73] Assignee: Kabushiki Kaisha Toshiba, Kawasaki, Japan

[21] Appl. No.: 705,528

[22] Filed: Aug. 29, 1996

[30] Foreign Application Priority Data

Sep. 1, 1995 [JP] Japan ................. 7-225378

[51] Int. Cl.⁶ ......................................... H01L 21/44
[52] U.S. Cl. .................. 438/675; 438/671; 438/672; 438/666; 438/641; 438/645
[58] Field of Search .................... 437/195, 192; 438/674, 675, 669, 671, 672, 666, 641, 645

[56] References Cited

U.S. PATENT DOCUMENTS

| 4,824,802 | 4/1989 | Brown et al. | 437/192 |
| 4,987,099 | 1/1991 | Flanner | 437/192 |
| 5,262,354 | 11/1993 | Cote et al. | 437/195 |

FOREIGN PATENT DOCUMENTS 3-244230  10/1991  Japan.

Primary Examiner—Charles L. Bowers, Jr.
Assistant Examiner—Lynne A. Gurley
Attorney, Agent, or Firm—Finnegan, Henderson, Farabow, Garrett & Dunner, L.L.P.

[57] ABSTRACT

The uniformity in buried condition of conductors in contact holes is enhanced over the entire wafer surface. A first resist is coated on a conductor provided selectively in a contact hole formed in an insulating film provided on a semiconductor substrate, as well as on the insulating film, and a resultant structure is flattened. The first resist and the conductor are removed with their portions being left. A second resist is coated on the conductor and insulating film and a resultant structure is flattened. The second resist and the conductor are removed until the insulating film is exposed.

22 Claims, 4 Drawing Sheets

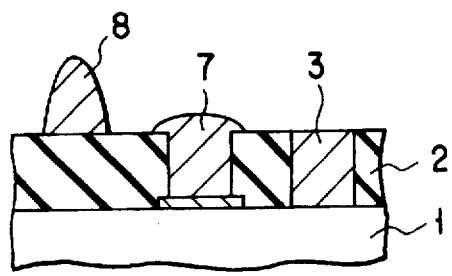
F I G. 1
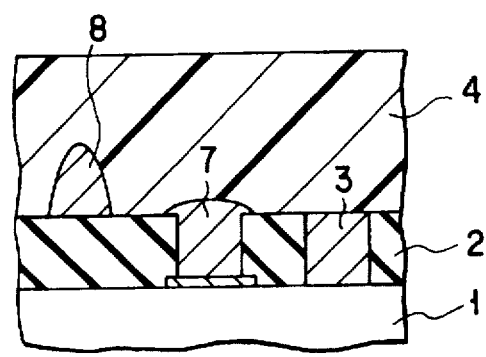
F I G. 2
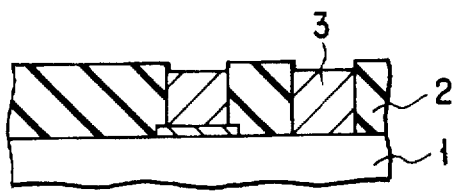
F I G. 3
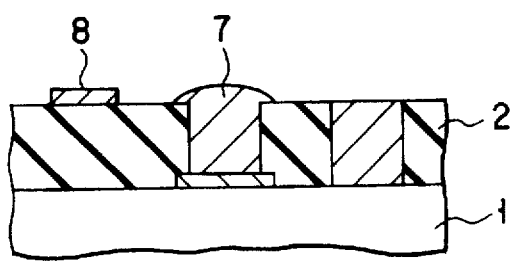
F I G. 5A
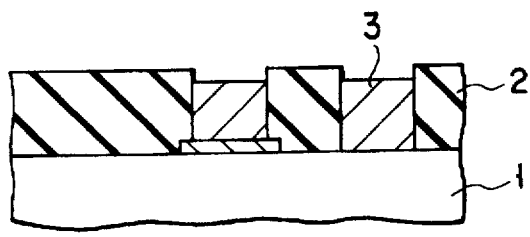
F I G. 5B
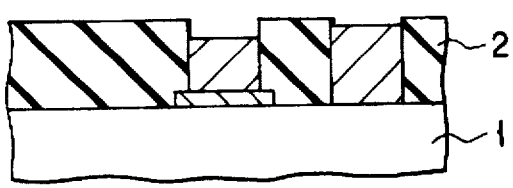
F I G. 6A
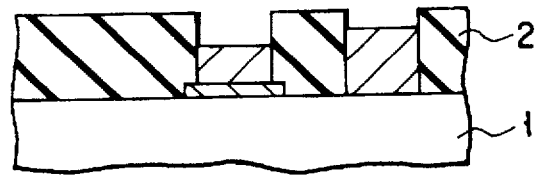
F I G. 6B

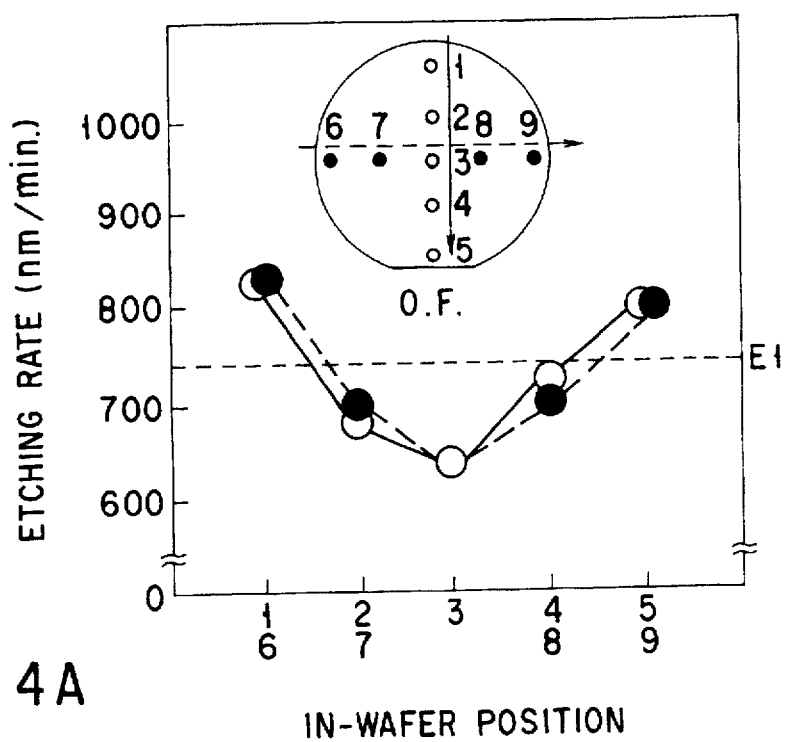
F I G. 4A
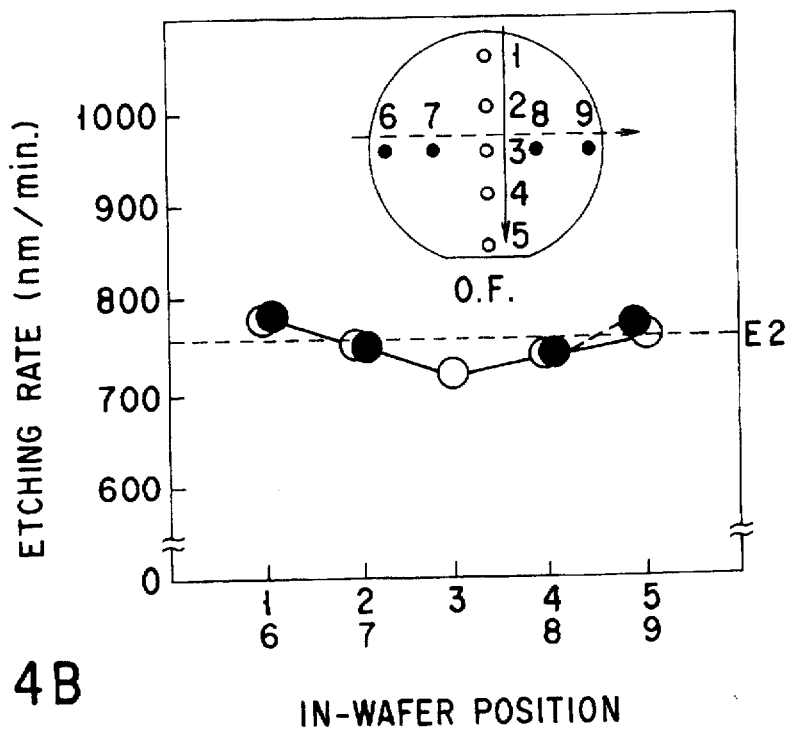
F I G. 4B

METHOD OF MANUFACTURING A SEMICONDUCTOR DEVICE WITH IMPROVED UNIFORMITY OF BURIED CONDUCTOR IN CONTACT HOLES

BACKGROUND OF THE INVENTION

1. Field of the Invention

The present invention relates generally to a method of manufacturing a semiconductor device, and more particularly to a method of selectively burying a conductor in contact holes formed in an interlayer insulating film.

2. Description of the Related Art

With a development in integration density of semiconductor devices, miniaturization of devices and an increase in number of wiring layers have been advanced more and more. Accordingly, the aspect ratio of a contact hole (or via hole) has increased. With a conventional sputtering method having low step coverage, it is difficult to fully bury a metal film in a contact hole. Under the circumstances, various methods have been proposed for selectively growing metal films in fine contact holes. For example, when tungsten is grown in vapor phase by a silane reduction method or an oxygen reduction method, no tungsten film grows on an inorganic layer such as an oxide film ($SiO_2$). A tungsten film grows only on a silicon substrate exposed to the contact hole or a metal. Thus, selective growth of tungsten film is achieved.

There are problems, however, when a metal film is selectively buried in the contact hole. One problem is that the depth of contact holes is irregular because of the structure of the device. For example, the depth of a contact hole on a device isolation region formed by a selective oxidation method is less than that of a contact hole on a substrate. Besides, a contact hole on a second or a third wiring layer is shallower than a contact hole on a substrate. Because of a difference in depth of contact holes, if a metal film is fully buried in the deepest hole, the metal film is overflown from the shallow contact hole.

In addition, even if the aforementioned selective growth method is used, it is difficult to achieve perfect selectivity. The reason appears to be that impurities such as sodium adhering to the surface of an interlayer insulating film will become nuclei of metal film growth. In this case, a metal film having a thickness equal to the depth of the contact hole in which the metal film is to be buried is grown on the interlayer insulating film. FIG. 1 illustrates this problem. When a metal film 3 is buried in the deepest contact hole, a metal film 7 overflows from a shallow contact hole or a metal film 8 forms locally on an insulating film 2.

To solve the above problems, a step called "resist etch-back" has been performed after selective growth of metal film in the prior art. A conventional etch-back step will now be described with reference to the accompanying drawings. This technique is disclosed in detail in Jpn. Pat. Appln. KOKAI Publication No. 3-244230.

As is shown in FIG. 2, after metal films 3, 7 and 8 of, e.g. tungsten have been selectively grown as conductors, a resist 4 is coated on the metal films 3, 7 and 8 and interlayer insulating film 2 until the surface of the result structure is flattened. The thickness of coated resist 4 varies, depending on the thickness of the tungsten metal film 8 formed on the interlayer insulating film 2. For example, when the depth of the deepest contact hole is 1.2 μm, the tungsten film 8 having a thickness of 1.2 μm is formed on the interlayer insulating film 2. In order to flatten the tungsten film 8, a resist 2.5 μm thick is needed.

Subsequently, as shown in FIG. 3, plasma dry etching is performed until the interlayer insulating film 2 is exposed, by using a gas containing sulfur hexafluoride and oxygen. In this case, the conditions for etching are set so that the etching rate of the resist may be equalized to that of the tungsten. Thereby, the tungsten films 7 and 8 on the interlayer insulating film 2, as well as the resist 4, can be removed, and the tungsten can be buried only in the contact holes.

In the plasma dry etching, the in-plane uniformity of the etching rate of the resist is about 2%, while the in-plane uniformity of the etching rate of the tungsten is not good.

FIG. 4A is a characteristic diagram showing the wafer in-plane position dependency of the etching rate of the tungsten, and FIG. 4B is a characteristic diagram showing the wafer in-plane position dependency of the etching rate of the resist. As shown in FIGS. 4A and 4B, the etching rate of tungsten is low at a central region of the substrate and is high at a peripheral region of the substrate. Thus, if the in-plane mean value of the etching rate of tungsten (indicated by broken line E1 in FIG. 4A) is combined with the in-plane mean value of the etching rate of resist (indicated by broken line E2 in FIG. 4B), the tungsten is etched at a lower rate than the resist in the central region of the substrate, while the tungsten is etched at a higher rate than the resist in the peripheral region of the substrate.

Consequently, if the etching is finished when the resist 4 on the interlayer insulating film 2 has been removed, as shown in FIGS. 5A and 5B, the tungsten films 7 and 8 are left in the central portion of the substrate (FIG. 5A) while the tungsten film 3 is excessively removed from the contact hole in the peripheral region of the substrate (FIG. 5B). Alternatively, if the tungsten films on the interlayer insulating film 2 are over-etched in order to achieve complete removable, as shown in FIGS. 6A and 6B, the tungsten film 3 in the contact hole is excessively etched in the peripheral portion of the substrate (FIG. 6B) and thus the tungsten cannot be fully buried in the contact hole. For example, when a resist 2.5 μm thick is etched, the difference in height of tungsten films in contact holes is about 0.4 μm between the central region and peripheral region of the substrate. This difference corresponds to 30% or more of the contact hole 1.2 μm deep.

As has been described above, in the conventional method of manufacturing the semiconductor device, the selectivity of the tungsten selective growth is imperfect and the tungsten on the interlayer insulating film is removed by the resist etch-back step. However, the in-plane uniformity of the etching rate of tungsten in the plasma dry etching performed in this case is not good. As a result, the height in tungsten film in contact holes varies greatly between the central portion and peripheral portion of the substrate.

SUMMARY OF THE INVENTION

The object of the present invention is to provide a method of manufacturing a semiconductor device wherein the uniformity in buried condition of conductors in contact holes can be enhanced over the entire treatment surface (wafer surface).

This object is achieved by a method of manufacturing a semiconductor device, comprising the steps of:

forming a first resist layer by coating a resist on a conductor provided selectively in a contact hole formed in an insulating film provided on a semiconductor substrate, as well as coating the resist on the insulating film, and flattening a resultant structure;

removing an upper portion of the first resist layer and an upper portion of the conductor;

forming a second resist layer by coating a resist on the conductor and the insulating film, and flatting a resultant structure; and removing the second resist layer and the conductor, and exposing the insulating film.

According to the method of the present invention, the step of removing the flattened resist layer is performed twice. Thus, the conductor remaining due to an in-plane variation in etching rate in the step of removing the upper portions of the first resist layer and the conductor can be completely removed in the step of removing the second resist layer and the conductor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 1 is a cross-sectional view of a semiconductor structure, illustrating a problem which will occur when a metal film is grown in contact holes by a selective growth method;

FIG. 2 is a first cross-sectional view illustrating a general method for solving the problem occurring in the structure shown in FIG. 1;

FIG. 3 is a second cross-sectional view illustrating a general method for solving the problem occurring in the structure shown in FIG. 1;

FIG. 4A is a characteristic diagram showing the wafer in-plane position dependency of the etching rate of tungsten;

FIG. 4B is a characteristic diagram showing the wafer in-plane position dependency of the etching rate of a resist;

FIG. 5A is a cross-sectional view showing the structure of a central region of a substrate after etching;

FIG. 5B is a cross-sectional view showing the structure of a peripheral region of the substrate after the etching;

FIG. 6A is a cross-sectional view showing the structure of the central region of the substrate after over-etching;

FIG. 6B is a cross-sectional view showing the structure of the peripheral region of the substrate after the over-etching;

FIGS. 7A and 7B through FIGS. 11A and 11B are cross-sectional views illustrating successively the steps of burying tungsten in contact holes according to a method of manufacturing a semiconductor device of the present invention, showing in parallel the central region of the substrate (FIG. 7A through FIG. 11A) and the peripheral region of the substrate (FIG. 7B through FIG. 11B);

DETAILED DESCRIPTION OF THE PREFERRED EMBODIMENTS

FIGS. 7A and 7B through FIGS. 11A and 11B are cross-sectional views illustrating successively the steps of burying tungsten in contact holes according to a method of manufacturing a semiconductor device of the present invention, showing in parallel the central region of the substrate (FIG. 7A through FIG. 11A) and the peripheral region of the substrate (FIG. 7B through FIG. 11B).

Figure 7A:
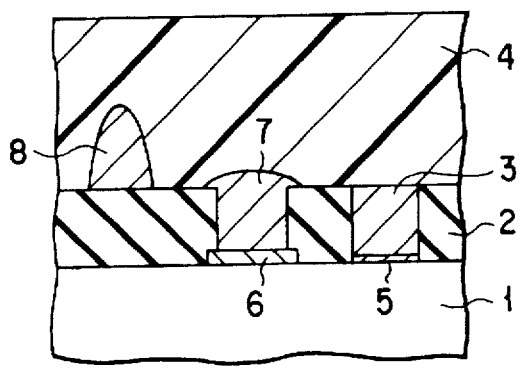
Figure 7B:
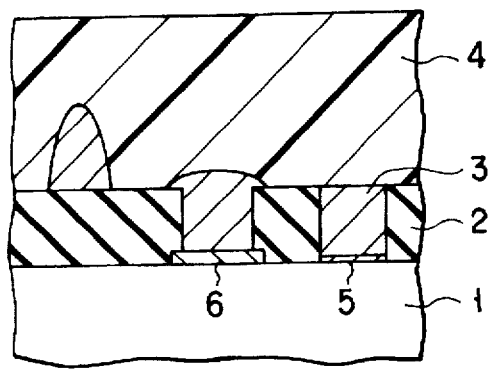

As is shown in FIGS. 7A and 7B, metal conductor films 3 of, e.g. tungsten, are selectively grown in contact holes formed on an interlayer insulating film 2 on a substrate 1. Then, a resist 4 is coated on the metal (tungsten) films 3 and interlayer insulating film 2 until the surface of a resultant structure becomes flat. In this embodiment, the contact holes are formed on a barrier metal 5 of titanium silicide (TiSi) provided over the substrate 1 and on a wiring layer 6 of tungsten silicide (WSi) provided over the substrate 1. The depth of the deepest contact hole formed on the substrate 1 is, e.g. 1.2 μm, and the depth of the relatively shallow contact hole on the wiring layer 6 is 1.0 μm. As a result, an overflow tungsten portion 7 with a thickness of 0.2 μm projects from the relatively shallow contact hole. Since the selectivity of tungsten is imperfect, a tungsten film 8 with a thickness of 1.2 μm forms on the interlayer insulating film 2. The thickness of the coated resist 4 varies depending on the thickness of the tungsten film 8 formed on the interlayer insulating film 2. For example, in the present embodiment, a resist film 2.5 μm thick is needed to flatten a stepped portion of 1.2 μm.

Figure 8A:
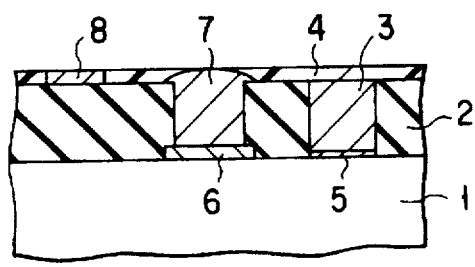
Figure 8B:
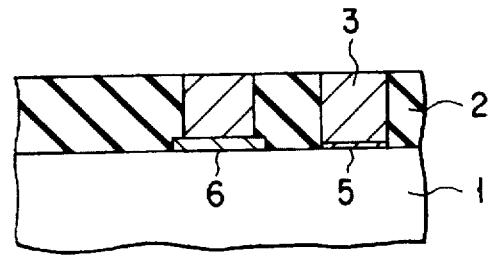
Figure 9A:
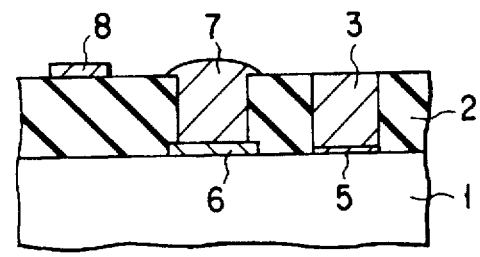
Figure 9B:
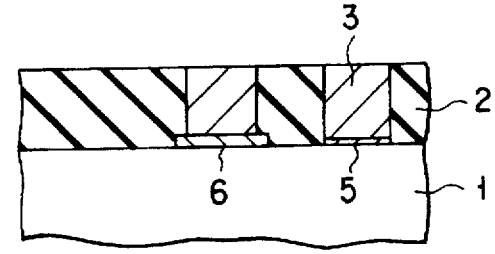

Then, as shown in FIGS. 8A and 8B, plasma dry etching is performed by using a gas of, e.g. sulfur hexafluoride and oxygen. At this time, the etching rate of tungsten is lower in the central region of the substrate than in the peripheral portion thereof, as mentioned above. Thus, the conditions for etching are set so that the mean value of the etching rate of tungsten may be equal to that of the etching rate of the resist. The plasma dry etching is stopped when the resist 4 in the region with the higher etching rate, i.e. the peripheral region of the substrate (FIG. 8B) in this embodiment, has been removed. Due to the wafer in-plane variance in etching rate, the resist 4 and tungsten films 7 and 8 with a thickness of, e.g. about 0.2 μm, are left on the insulating film 2 in the central region of the substrate in FIG. 8A.

The comparison in etching rate between the tungsten and the resist will now be described in greater detail with reference to FIGS. 4A and 4B. According to FIGS. 4A and 4B, both etching rates of the tungsten and resist are higher in the peripheral region than in the central region of the substrate. More specifically, the wafer in-plane position dependency of the etching rate of tungsten is higher than that of the etching rate of resist. For example, if the mean value of the etching rate of tungsten and that of the etching rate of resist are set equally at about 750 nm/min., the etching rate of tungsten is lower than that of resist in the central region of the substrate, and the etching rate of tungsten is higher than that of resist in the peripheral region of the substrate. If the etching is stopped when the resist 4 on at least the peripheral region of the substrate has been removed, the tungsten 7, 8 on the insulating film 2 in the peripheral region of the substrate are completely etched since the etching rate of tungsten is higher than that of resist in the peripheral region of the substrate. However, the tungsten 7, 8 on the insulating film 2 in the central region of the substrate are left since the etching rate of tungsten is lower than that of resist in the central region of the substrate.

Thereafter, the remaining resist 4 is removed, for example, by an ashing step using an oxygen plasma called "asher."

Figure 10A:
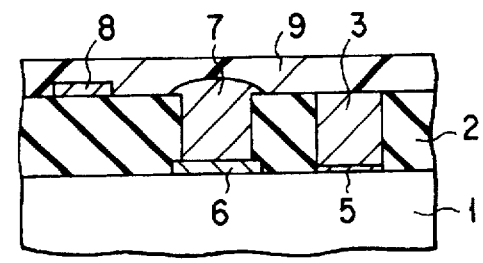
Figure 10B:
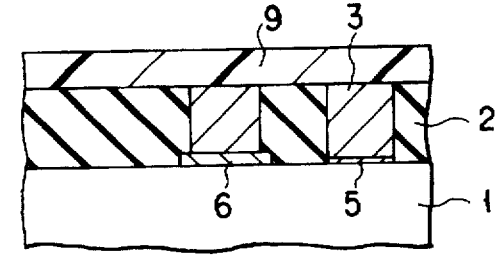

Subsequently, as shown in FIGS. 10A and 10B, a second resist 9 is coated over the interlayer insulating film 2 and tungsten films 3, 7 and 8 until the surface of a resultant structure is flattened. For example, a resist 0.55 μm thick is needed in order to flatten a stepped portion of 0.2 μm.

Figure 11A:
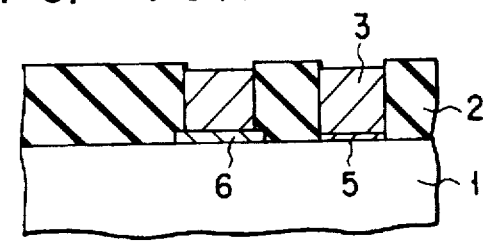
Figure 11B:
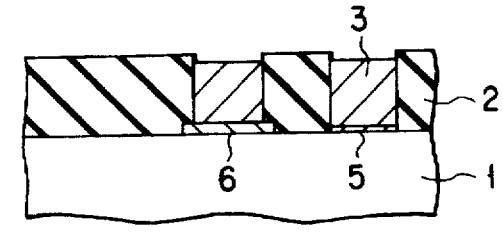

Then, as shown in FIGS. 11A and 11B, plasma dry etching is performed by using a gas of, e.g. sulfur hexafluoride and oxygen. The second etching step is carried out until all the second resist 9 on the interlayer insulating film 2 is removed. For example, when the resist 9 on the interlayer insulating film 2 is removed and the interlayer insulating film 2 is exposed, a gas generated at the time of etching the insulating film 2 can be detected. From this time point, over-etching is performed under proper control. Thereby, all the resist 9 can be removed without leaving unetched resist 9. In order to prevent the interlayer insulating film 2 from being excessively etched by over-etching, it is necessary to set the condition for etching such that the etching selectivity of tungsten is, for example, about three times as high as the etching selectivity of the interlayer insulating film 2. Thereby, the tungsten films 7 and 8 on the interlayer insulating film 2 are removed and the tungsten can be buried only in the contact holes.

As has been described above, in the present invention, the etch-back step is performed twice and thus the tungsten films 7 and 8 left by the first etch-back step can be removed by the second etch-back step. Since the thickness of stepped portions formed by the tungsten films 7 and 8 on the interlayer insulating film 2 is reduced by the first etch-back step, the thickness of the second resist 9 for flattening the stepped portions can be made less than that of the first resist 4. Thus, the over-etch time in the second etch-back step can be reduced and the tungsten 3 in the contact hole can be prevented from being etched and reduced in thickness. The difference in reduced thickness of tungsten 3 between the central region (FIG. 11A) and peripheral region (FIG. 11B) of the substrate is proportional to the over-etch time. Thus, this difference can be decreased by reducing the over-etch time.

Figure 12:
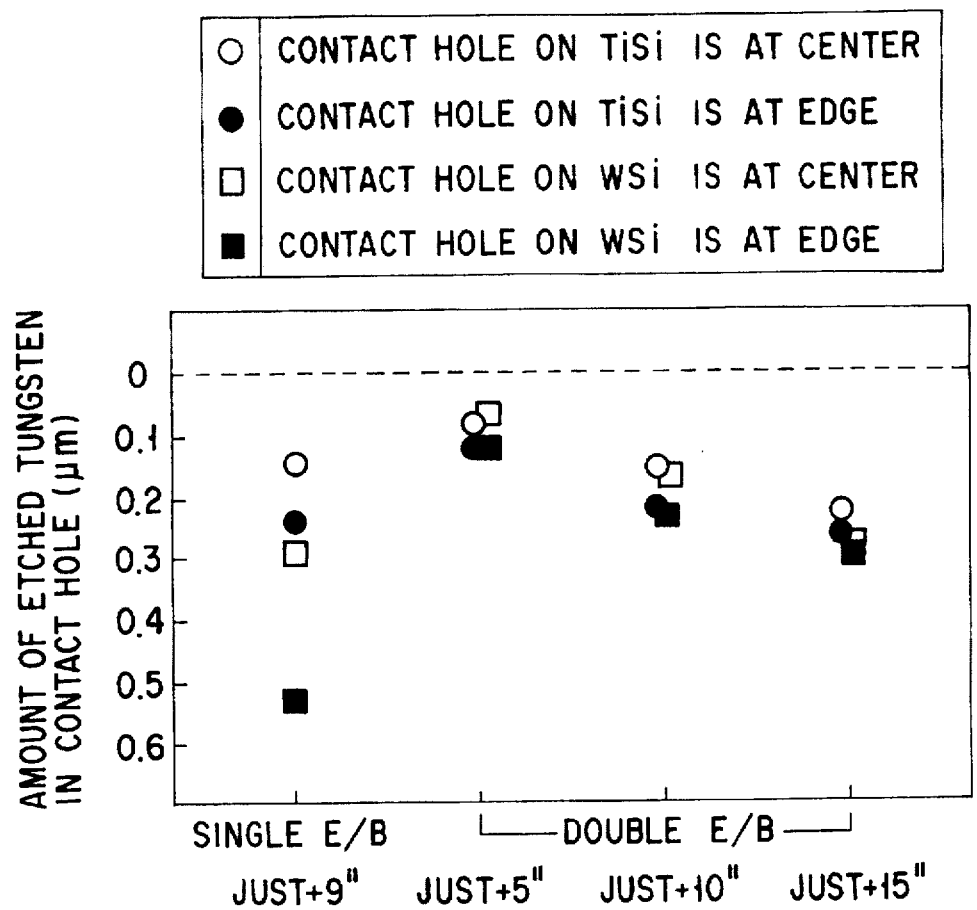
FIG. 12 is an evaluation diagram showing comparison in amount of etched tungsten in contact holes between the method of the embodiment of the present invention and the conventional method.

FIG. 12 is an evaluation diagram showing comparison in amount of etched tungsten in contact holes in the tungsten burying step between the method of the embodiment of the present invention and the conventional method. The symbols in the leftmost column of FIG. 12 indicate the conventional method in which tungsten is buried in contact holes by a single etch-back step, and the symbols in the three columns on the right side indicate the method of the present invention in which tungsten is buried in contact holes by double etch-back steps. The over-etch time in the second etch-back step varies from 5 sec. to 10 sec. to 15 sec. In each case, the amounts of etched tungsten in contact holes on titanium silicide (Tisi) and tungsten silicide (WSi) on the central region ("CENTER") and peripheral region ("EDGE") of the substrate were measured. It is understood that as compared to the conventional method, in the present method, the amount of etched tungsten can be reduced, in particular, on the tungsten silicide, and the difference in amount of etched tungsten in the etching treatment surface can be reduced from 0.4 μm (prior art) to 0.1 μm.

Figure 13:
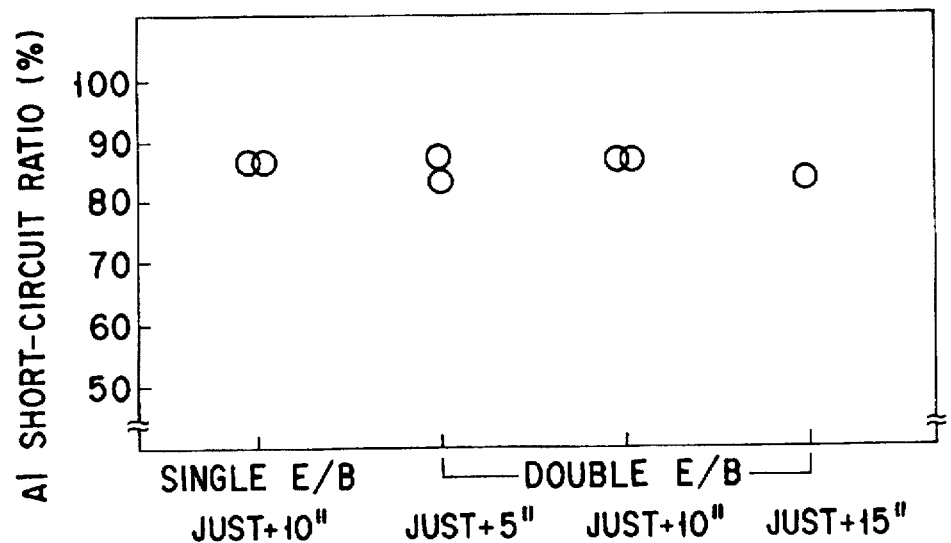
FIG. 13 is an evaluation diagram showing results of measurement of short-circuit ratios (conductivity of a diffusion layer on the substrate and aluminum (Al) wiring) in the case where aluminum (Al) wiring is formed after finishing the step of burying tungsten in contact holes according to the method of the embodiment of the present invention and the method of the prior art.

FIG. 13 is an evaluation diagram showing results of measurement of short-circuit ratios (conductivity of a diffusion layer on the substrate and aluminum (Al) wiring) in the case where aluminum (Al) wiring is formed after finishing the step of burying tungsten in contact holes according to the method of the embodiment of the present invention and the method of the prior art. Like FIG. 12, FIG. 13 shows a result of a single etch-back step as in the prior art and a result of double etch-back steps with varied over-etch time periods according to the embodiment of the present invention. It is found that about 90% of short-circuit ratio is obtained in both cases of single etch-back and double etch-back and there is no problem.

In the above-described embodiment, the etching is stopped when the resist 4 in the peripheral region of the substrate has been removed in the first etch-back step. The etching, however, may be stopped at a proper time in accordance with the etching rate of resist 4 and the etching rate of, e.g. tungsten films 3, 7 and 8. Since the tungsten films 3, 7 and 8 are etched at a higher rate than the resist 4 in the peripheral region of the substrate, as described above, the etching may be stopped, for example, when the tungsten film 8 in the peripheral region of the substrate has been removed.

In the above embodiment, after the first resist etch-back step, the remaining resist film 4 is removed by means of, e.g. the asher. However, without removing the remaining resist 4, the second resist 9 may be deposited on the remaining resist 4.

In the above embodiment, the buried tungsten structure is achieved by the second resist etch-back step. In the first flattening step, resist etch-back may not be performed. For example, after the resist is coated until the surface of the resultant structure is flattened, chemical dry etching (CDE) may be performed in place of plasma dry etching. Alternatively, without coating the resist, the tungsten on the insulating film may be polished away by chemical mechanical polishing (CMP). In either case, the tungsten remaining due to in-plane non-uniformity of etching in the first flattening step can be completely removed by the second etch-back step. Since most of the tungsten on the interlayer insulating film has been removed in the first flattening step, the thickness of the resist in the second flattening step can be reduced and the over-etch time can be shortened. Accordingly, a decrease in thickness of tungsten film in the contact hole can be limited and an in-plane variance in reduced thickness can be decreased.

Although the tungsten film is used as conductor to be buried, a high-melting-point metal film such as titanium film or another metal film or conductor film may be used.

In the embodiment of the invention, the resist is used in the flattening step. However, a resin other than the resist may be coated until the stepped portion is flattened and may be etched back by plasma dry etching as in the above embodiment.

The gas containing sulfur hexafluoride and oxygen is used in the plasma dry etching. This gas may be replaced with an inert gas such as nitrogen ($N_2$).

As has been described above, in the method of manufacturing the semiconductor device according to the present invention, the uniformity in buried condition of conductors in contact holes can be enhanced over the entire etching treatment surface.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:
   preparing a semiconductor substrate having an insulating film formed thereon and a first conductive film provided in a contact hole which is selectively formed in the insulating film so as to make an overflow portion out of the contact hole, the semiconductor substrate further having a second conductive film formed on the insulating film and made of the same material as that of the first conductive film;
   forming a first resist layer by coating a resist on the insulating film so as to bury the second conductive film and the overflow portion of the first conductive film in the insulating film and flatten a resultant structure;
   removing upper portions of the first resist layer and the second conductive film;
   forming a second resist layer, which is thinner than the first resist layer, by coating a resist on the insulating film, after said step of removing the upper portions of the first resist layer and the second conductive film, so as to bury the rest of the second conductive film and the overflow portion of the first conductive film and to flatten a resultant structure; and
   removing the second resist layer, the rest of the second conductive film, and the overflow portion of the first conductive film to expose the insulating film.

2. The method according to claim 1, wherein in said step of removing the upper portions of the first resist layer and the second conductive film, an in-plane mean value of the etching rate of the conductive material is equal to the etching rate of the first resist layer, and in said step of removing the second resist layer, the rest of the second conductive film, and the overflow portion of the first conductive film, an in-plane mean value of the etching rate of the conductive material is equal to the etching rate of the second resist layer.

3. The method according to claim 1 or 2, wherein said step of removing the upper portions of the first resist layer and the second conductive film is finished when part of the insulating film has been exposed.

4. The method according to claim 1 or 2, wherein in said step of removing the second resist layer, the rest of the second conductive film, and the overflow portion of the first conductive film, the first conductive film is further removed under control from a time point when part of the insulating film has been exposed.

5. The method according to claim 1, further comprising a step of removing a remaining portion of said first resist layer prior to the step of forming the second resist layer.

6. The method according to claim 1 or 2, wherein the first conductive film includes a high-melting-point metal selectively grown in the contact hole by a chemical vapor growth process.

7. The method according to claim 6, wherein the first conductive material is tungsten, and plasma dry etching is performed in said upper portions removing step.

8. The method according to claim 7, wherein a gas containing sulfur hexafluoride and oxygen is used in the plasma dry etching.

9. The method according to claim 7, wherein a gas containing sulfur hexafluoride and oxygen, which is admixed with an inert gas, is used in the plasma dry etching.

10. The method according to claim 6, wherein in said step of removing the upper portions of the first resist layer and the first conductive film, chemical dry etching is used.

11. The method according to claim 6, wherein in said step of removing the upper portions of the first resist layer and the first conductive film, chemical mechanical etching is used.

12. A method of manufacturing a semiconductor device, comprising the steps of:
    preparing a semiconductor substrate having an insulating film formed thereon;
    providing first, second, and third conductive films made of a same conductive material, the first conductive film buried within the insulating film in a contact hole, the second conductive film at least partially extending beyond the surface of the insulating film, the first and second conductive films having two different depths relative to the surface of the insulating film, and the third conductive film placed at least partially within or on the insulating film;
    forming a first resist layer by coating a resist on the insulating film so as to bury the first, second, and third conductive films and to flatten a first resultant structure;
    removing a first upper portion of the first resist layer and a first upper portion of the first, second, and third conductive films, wherein the first and second conductive films have substantially the same removal rate and the third conductive film has a substantially different removal rate;
    forming a second resist layer, which is thinner than the first resist layer, by coating a resist on the insulating film so as to bury the remaining portions of the first, second, and third conductive films that extend beyond the surface of the insulating layer and to flatten a second resultant structure; and
    removing the second resist layer and a second upper portion of the first, second, and third conductive films to expose the insulating film.

13. The method according to claim 12, wherein in said step of removing the first upper portion of the first resist layer and the first upper portion of the first, second, and third conductive films, an in-plane mean value of the removal rate of the conductive material is equal to the removal rate of the first resist layer, and in said step of removing the second resist layer and the second upper portion of the first, second, and third conductive films, an in-plane mean value of the removal rate of the conductive material is equal to the removal rate of the second resist layer.

14. The method according to claim 12 or 13, wherein said step of removing the upper portion of the first resist layer and the first upper portion of the first, second, and third conductive films is finished when part of the insulating film has been exposed.

15. The method according to claim 12 or 13, wherein in said step of removing the second resist layer and the second upper portion of the first, second, and third conductive films, the second upper portion of the first, second, and third conductive films is further removed under control from a time point when part of the insulating film has been exposed.

16. The method according to claim 12, further comprising a step of removing a remaining portion of the first resist layer prior to the step of forming the second resist layer.

17. The method according to claim 12 or 13, wherein the first conductive film includes a high-melting-point metal selectively grown in the contact hole by a chemical vapor growth process.

18. The method according to claim 17, wherein the conductive material is tungsten, and plasma dry etching is performed in the step of removing the first upper portion of the first, second, and third conductive films.

19. The method according to claim 18, wherein a gas containing sulfur hexafluoride and oxygen is used in the plasma dry etching.

20. The method according to claim 18, wherein a gas containing sulfur hexafluoride and oxygen, which is admixed with an inert gas, is used in the plasma dry etching.

21. The method according to claim 17, wherein in said step of removing the upper portion of the first resist layer and the first upper portion of the first, second, and third conductive films, chemical dry etching is used.

22. The method according to claim 17, wherein in said step of removing the upper portion of the first resist layer and the first upper portion of the first, second, and third conductive films, chemical mechanical etching is used.

* * * * *